(12) United States Patent
Pellerin et al.

(10) Patent No.: US 6,228,758 B1
(45) Date of Patent: May 8, 2001

(54) METHOD OF MAKING DUAL DAMASCENE CONDUCTIVE INTERCONNECTIONS AND INTEGRATED CIRCUIT DEVICE COMPRISING SAME

(75) Inventors: John G. Pellerin, Austin, TX (US); Thomas Werner, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/172,982

(22) Filed: Oct. 14, 1998

(51) Int. Cl.⁷ ............................................... H01L 21/4763
(52) U.S. Cl. .................. 438/624; 438/625; 438/637; 438/638; 438/666; 438/668; 438/672; 438/738
(58) Field of Search ..................................... 438/618, 623, 438/624, 625, 637, 638, 666, 668, 672, 738

(56) References Cited

U.S. PATENT DOCUMENTS

| | | | |
|---|---|---|---|
| 4,423,547 | 1/1984 | Farrar et al. | 29/571 |
| 5,219,787 | 6/1993 | Carey et al. | 437/187 |
| 5,578,523 | * 11/1996 | Fiordalice et al. | 438/638 |
| 5,595,937 | 1/1997 | Mikagi | 437/192 |
| 5,612,254 | 3/1997 | Mu et al. | 437/195 |
| 5,635,423 | 6/1997 | Huang et al. | 437/195 |
| 5,726,100 | 3/1998 | Givens | 438/702 |
| 5,736,457 | 4/1998 | Zhao | 438/624 |
| 5,741,741 | 4/1998 | Tseng | 438/637 |
| 5,741,742 | 4/1998 | Kamide | 438/653 |
| 5,783,485 | 7/1998 | Ong et al. | 438/637 |
| 6,033,977 | * 3/2000 | Gutsche et al. | 438/618 |

FOREIGN PATENT DOCUMENTS

| | | | |
|---|---|---|---|
| 0 435 187 | 12/1990 | (EP) | H01L/21/28 |
| 0 680 084 | 4/1995 | (EP) | H01L/21/768 |

* cited by examiner

*Primary Examiner*—Jey Tsai
*Assistant Examiner*—Lynne Gurley
(74) *Attorney, Agent, or Firm*—Williams, Morgan & Amerson, P.C.

(57) ABSTRACT

A method of forming conductive interconnections on an integrated circuit device and an integrated circuit device comprising the same is disclosed. The method is comprised of forming first and second layers of dielectric materials that are selectively etchable with respect to one another. The method also comprises forming the second layer above the first layer and in a previously defined opening in the first layer. The method further comprises removing portions of the second layer to define an opening therein and to remove the portion of the second layer previously deposited in the opening in the first layer. Thereafter, a conductive material is positioned in both of the openings in the first and second layers. The integrated circuit device is comprised of first and second layers of dielectric material having openings formed therein and an integrally formed conductive structure formed only in the openings in the first and second layers.

12 Claims, 3 Drawing Sheets

METHOD OF MAKING DUAL DAMASCENE CONDUCTIVE INTERCONNECTIONS AND INTEGRATED CIRCUIT DEVICE COMPRISING SAME

BACKGROUND OF THE INVENTION

1. Field of the Invention

The present invention is generally related to semiconductor processing, and, more particularly, to the formation of multi-level conductive interconnects on integrated circuit devices.

2. Description of the Related Art

A conventional integrated circuit device, such as a microprocessor, is typically comprised of many thousands of semiconductor devices, e g., transistors, formed above the surface of a semiconducting substrate. For the integrated circuit device to function, the transistors must be electrically connected to one another through conductive interconnections. Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

One particular technique used to form such conductive lines and plugs is known as a dual damascene technique. One variation of this technique involves the formation of a first layer of a dielectric material, formation of a relatively thin etch stop layer (for example comprised of silicon nitride) above the first dielectric layer, patterning of the etch stop layer to define openings corresponding to plugs to be formed in the first dielectric layer, and formation of a second dielectric layer above the etch stop layer. Thereafter, an etching process is used to define an opening in the second dielectric layer, and to remove portions of the first dielectric layer positioned under the openings previously formed in the etch stop layer. The openings in the first and second layers of dielectric material correspond to a yet to be formed metal plug and metal line, respectively. Thereafter, the openings in the first and second dielectric layers are filled with an appropriate metal or layers of metal.

The dual damascene technique is very labor-intensive in that it requires the formation of three process layers, the first and second dielectric layers as well as the etch stop layer. Additionally, the etch stop layer, which is typically comprised of a material having a relatively high dielectric constant, such as silicon nitride with a dielectric constant of approximately eight, tends to increase the capacitance between the adjacent metal lines. This increase in capacitance tends to reduce the speed at which electrical signals may travel along the metal line, which may cause a reduction in the operating speed of the integrated circuit device and increase the power consumption of the device (which tends to cause heat to build up in the entire device, e.g., a microprocessor).

The present invention is directed to a method and device for solving some or all of the aforementioned problems.

SUMMARY OF THE INVENTION

The present invention is directed to an integrated circuit device having improved conductive interconnections and method for making same. The method comprises forming first and second layers comprised of first and second dielectric materials, the first and second dielectric materials being selectively etchable with respect to one another. The second layer is formed above the first layer and in a previously formed opening in the first dielectric layer. The method further comprises removing portions of the second layer to define an opening in the second layer and to remove said second dielectric material from the opening in the first layer. The method also comprises forming a conductive material in the first and second openings in the first and second layers, respectively.

The present invention is also directed to an integrated circuit device having a novel conductive interconnection structure. The device is comprised of a first layer of a dielectric material and a second layer of a dielectric material positioned adjacent the first layer of dielectric material. The first and second layers of dielectric material have first and second openings formed therein, respectively. The device further comprises a conductive structure formed only in the first and second openings formed in the first and second layers of dielectric material.

BRIEF DESCRIPTION OF THE DRAWINGS

The invention may be understood by reference to the following description taken in conjunction with the accompanying drawings, in which like reference numerals identify like elements, and in which.

Figure 1:
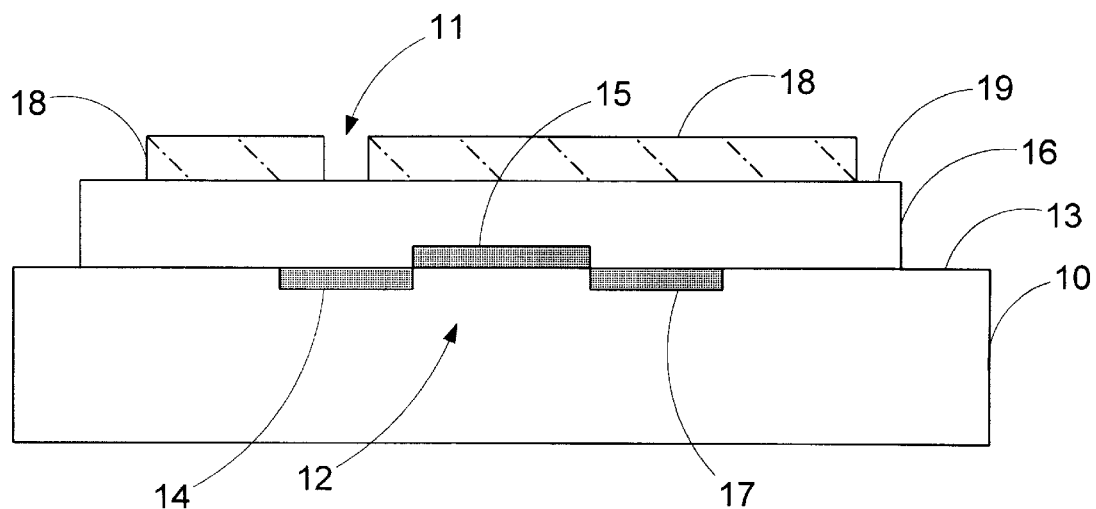
FIG. 1 is a cross-sectional view of a semiconductor device having a dielectric layer formed above the substrate, and a patterned layer of photoresist formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features on fabricated devices. Nevertheless, the attached drawings are included to describe and explain illustrative examples of the present invention.

In general, the present invention is directed to the formation of conductive interconnections on an integrated circuit device, e.g., the formation of electrically conductive lines or paths between multiple transistors on a microprocessor. In general, the method comprises forming conductive interconnections using first and second dielectric layers that may be selectively etched with respect to one another. As will be readily apparent to those skilled in the art upon a complete reading of the present application, the present method is applicable to a variety of technologies, e.g, NMOS, PMOS, CMOS, etc., and is readily applicable to a variety of devices, including, but not limited to, logic devices, memory devices, etc.

As shown in FIG. 1, an illustrative transistor 12 is formed on a surface 13 of a semi conducting substrate 10. The illustrative transistor 12 is comprised of a gate conductor 15, a source region 14, and a drain region 17. The transistor 12 may be formed by a variety of known techniques and its particular method of manufacture should not be construed as limiting the invention. Moreover, although the present invention will be disclosed in the context of forming a conductive interconnection to the source region 14 of the transistor 12, those skilled in the art will readily recognize that it is applicable to the interconnection of conductive lines or plugs formed on alternative layers of a semiconductor device.

As shown in FIG. 1, the first dielectric layer 16 is formed above the surface 13 of the semiconducting substrate 10 or on top of a previous interconnect layer (not shown). Thereafter, a layer of photoresist 18 is formed above the first dielectric layer 16, as shown in FIG. 1. The present invention will be described in the context of the formation of conductive plugs (not shown) in the first dielectric layer 16. However, those skilled in the art recognize that, instead of the conductive plugs, conductive lines (not shown) could be formed in the first dielectric layer 16. The photoresist layer 18 may be patterned using traditional photolithography techniques to define an opening 11. In one illustrative embodiment, the opening 11 is generally circular in nature (although other configurations are possible, e.g., square or rectangular) and corresponds to the size of the conductive plugs that will ultimately be formed in the first dielectric layer 16. Of course, for other applications, the opening 11 could be formed such that it corresponds to the metal lines that would be formed in the underlying dielectric layer.

The first dielectric layer 16 may be comprised of a variety of materials. For example, the first dielectric layer 16 may be comprised of either an organic-based material or a silicon-based material. That is, the first dielectric layer 16 may be comprised of an organic-based material such as a poly (arylene ether), such as Flare™ (trademark of AlliedSignal), a thermosetting oligomeric hydrocarbon, such as Silk™ (trademark of Dow Chemical), a poly(paraxylylene), such as AF-4™ (trademark of Specialty Coating Systems, Inc.), a poly(tetrafluoroethylene), such as Speedfilm™ (trademark of W. L. Gore), a poly(imide), a divinyl siloxane benzocyclobutane, such as Cyclotene™ (trademark of Dow Chemical). Alternatively, the first dielectric layer 16 may also be comprised of silicon-based materials, such as a fluorosilicate glass (FSG), hydrogen silsesquioxane (HSQ), silica xerogel, silica aerogel, silicon dioxide, silicon dioxide doped with boron or phosphorous, silicon oxynitride, silicon nitride, methyl silsesquioxane, etc. The first dielectric layer 16 may be formed by any of a variety of commonly used techniques for the formation of such layers, for example, chemical vapor deposition, low pressure chemical vapor deposition, plasma enhanced chemical vapor deposition, sputtering, spin-coating, condensation , surface reaction, etc. If desired, the surface 19 of the first dielectric layer 16 may be planarized by, for example, a chemical mechanical polishing process. The thickness of the first dielectric layer 16 may be varied as a matter of design choice. In one illustrative embodiment, the process layer 16 may have a thickness ranging from approximately 4,000–10,000 Å.

The layer of photoresist 18 may be applied by a variety of known techniques, such as classic spin-on techniques followed by the appropriate curing. Thereafter, the photoresist layer 18 may be developed and patterned to define the opening 11 in the process layer 18. In the illustrative embodiment, where a via will be formed in the first dielectric layer 16, the opening 11 corresponds to that via. The layer of photoresist 18 may have a thickness ranging anywhere from approximately 4000–10,000 Å, as a matter of design choice.

Figure 2:
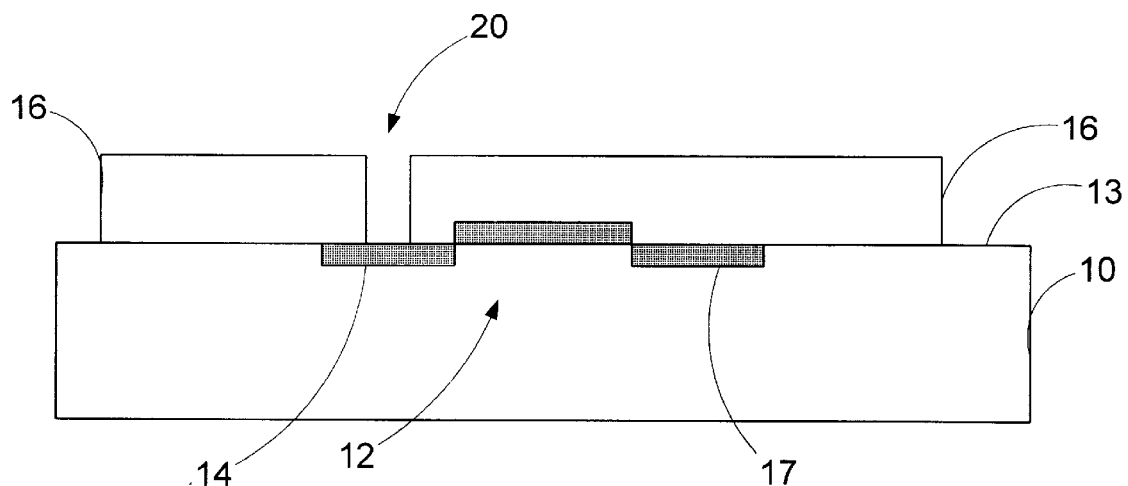
FIG. 2 is a cross-sectional view of the device shown in FIG. 1 after an opening has been formed in the first dielectric layer and the layer of photoresist has been removed.

The next process mvolves performing an etching process to define a via or opening 20 in the first dielectric layer 16, as shown in FIG. 2. This etching process can be performed by a variety of standard techniques using the appropriate etch chemistries for the material that comprises the first process layer 16. For example, the opening 20 may be formed by an anisotropic plasma etching process, or a reactive ion etching process. The photoresist layer 18 may then be stripped to result in the structure shown in FIG. 2. Of course, the photow resist layer may be partially consumed during the etching of layer 16.

Figure 3:
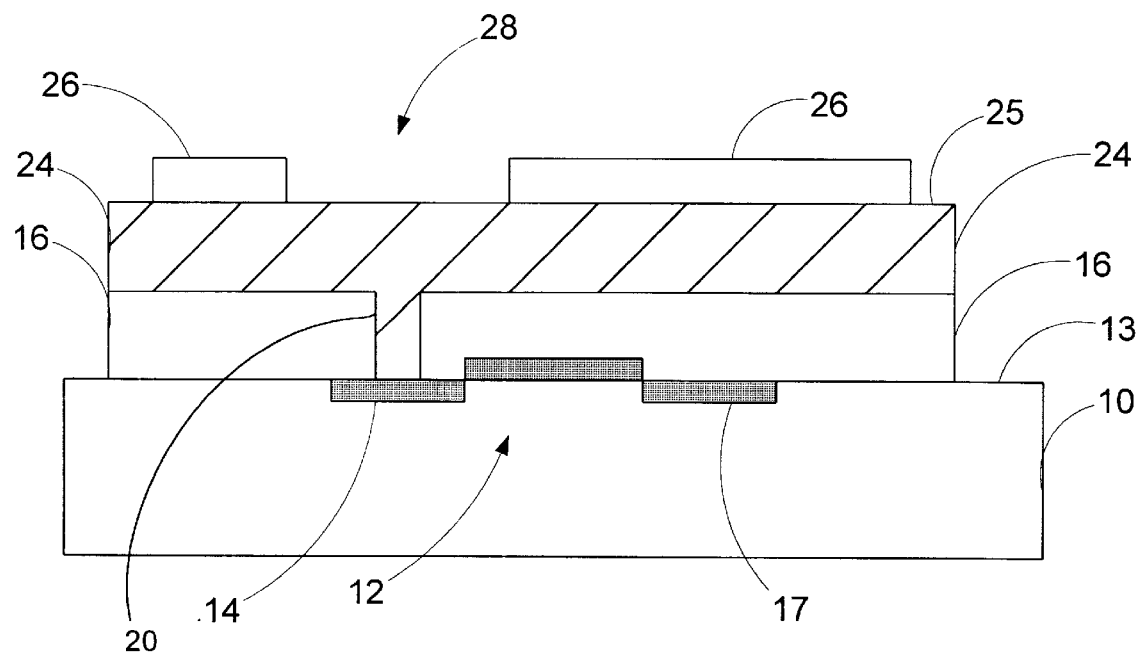
FIG. 3 is a cross-sectional view of the device shown in FIG. 2 after a second dielectric layer has been formed above the first dielectric layer, and a patterned layer of photoresist is formed above the second dielectric layer.
Figure 4:
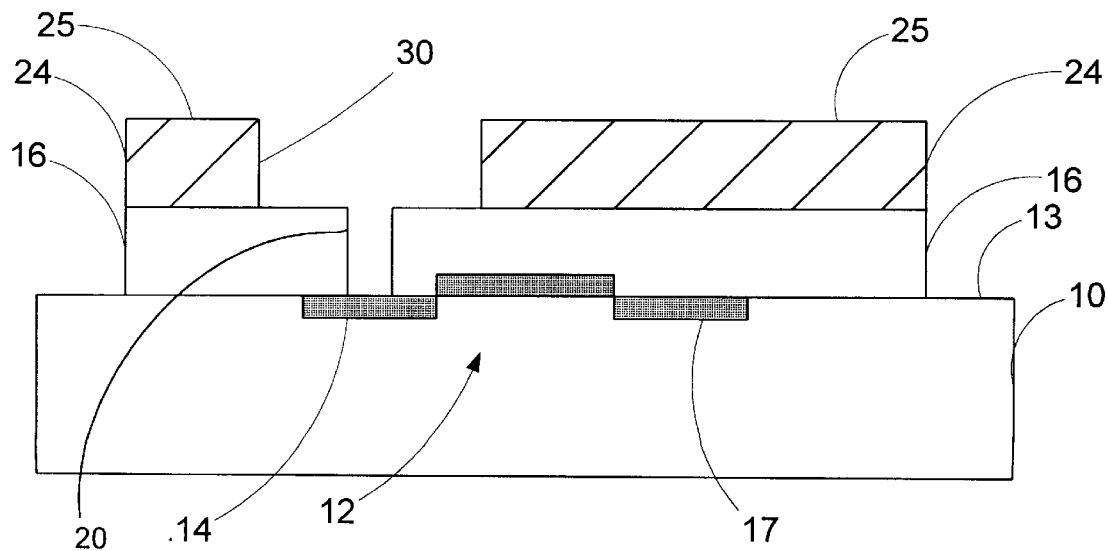
FIG. 4 is a cross-sectional view of the device shown in FIG. 3 after an opening has been formed in the second dielectric layer.

As shown in FIG. 3, the next process involves formation of a second dielectric layer 24 above the first dielectric layer 16. Note that a portion of the second dielectric layer 24 is formed in the opening 20 that was previously formed in the first dielectric layer 16. Thereafter, a second layer of photoresist 26 is formed above the second dielectric layer 24. The second photoresist layer 26 is patterned to define an opening 28. In the illustrative embodiment used to describe the present invention, the opening 28 formed in the photoresist layer 26 corresponds to the width of a conductive line, e.g., a copper or aluminum alloy line, that will be formed in the second dielectric layer 24.

The second dielectric layer 24 may be comprised of a variety of materials. For example, the second dielectric layer 24 may also be comprised of an organic-based material or a silicon-based material, such as those identified above with respect to the first dielectric layer 16. However, if the first dielectric layer 16 is comprised of an organic-based material, then the second dielectric layer 24 should be comprised of a silicon-based material. Conversely, if the first dielectric layer 16 is comprised of a silicon-based material, then the second dielectric layer 24 should be comprised of an organic-based material. The first dielectric layer 16 and the second dielectric layer 24 are made of different materials that may be selectively etched relative to one another. The second dielectric layer 24 may be formed by a variety of known techniques, such as those outlined above with respect to the first dielectric layer 16. The thickness of the second dielectric layer 24 may be varied as a matter of design choice. In one illustrative embodiment, the second dielectric layer 24 may have a thickness ranging from approximately 4,000–10,000 Å. Additionally, if desired, the surface 25 of the second dielectric layer 24 may be planarized by, for example, a chemical mechanical polishing operation or the layer 24 can be made of a self-planarizing material, e.g., a spin-on dielectric. Similarly, the second photoresist layer 26 may be formed by a variety of known techniques, e.g., spin-on, and subsequently developed to define the opening 28, as shown in FIG. 3.

The next process involves performing an etching step that selectively etches the second dielectric layer 24 with respect to the first dielectric layer 16. This etching process may be an anisotropic plasma or reactive ion etching process. The particular etching process and chemistries used to remove the second dielectric layer 24 are matters of design choice that will depend upon the materials selected for both the first dielectric layer 16 and the second dielectric layer 24. Note that during this selective etching process, the portion of the dielectric layer 24 previously formed in the opening 20 in the first dielectric layer 16 is also removed. Thereafter, the second photoresist layer 26 is stripped to result in the structure shown in FIG. 4.

Figure 5:
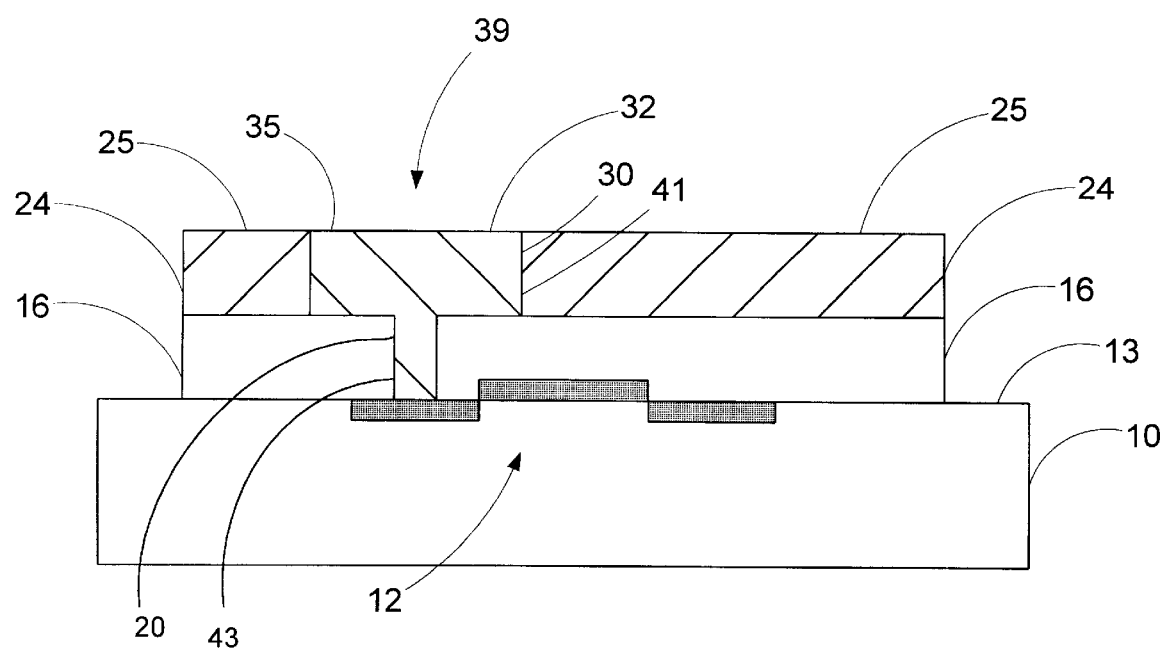
FIG. 5 is a cross-sectional view of the device shown in FIG. 4 after an appropriate metal has been positioned in the openings defined in the first dielectric layer and the second dielectric layer.

Thereafter, as shown in FIG. 5, an appropriate conductive material 32, such as a metal, may be deposited in both the opening 30 formed in the second dielectric layer 24 as well as the opening 20 formed in the first dielectric layer 16. The conductive material 32 may be comprised of a variety of materials, such as copper or copper alloy, aluminum or aluminum alloy, titanium or titanium alloy, tantalum or tantalum alloy, tungsten, or other like materials that may serve as a conductor. As will be readily recognized by those skilled in the art, the conductive material 32 constitutes an integrally formed conductive structure 39 that, in the particular illustrative embodiment used herein to describe the present invention, is comprised of a conductive line 41 and a conductive plug 43. In the particular embodiment depicted in the drawings, the conductive line 41 is positioned in the opening 30 in the second dielectric layer 24, and the conductive plug 43 is positioned in the opening 20 in the first dielectric layer 16. Note that this integrally formed conductive structure 39 is formed between two layers of dielectric material, layers 16 and 24. That is, in the structure depicted in FIG. 5, there is no separate etch stop layer between the first and second dielectric layers 16,24.

Of course, if desired, a liner (not shown) comprised of, for example, tantalum or titaniun, or alloys of these metals, may be positioned in the openings 30 and 20 prior to the formation of the conductive material 32 in the openings 20, 30. Lastly, if desired, the surface 25 of the second dielectric layer 24 and the surface 35 of the conductive material 32 may be planarized using, for example, a chemical mechanical polishing operation.

Through use of the present technique, multi-level conductive interconnections may be made using fewer process steps than are currently involved in making such interconnections using traditional technology. Additionally, the resulting structure will have a lower capacitance since the present technique allows omission of the etch stop layer, traditionally comprised of a relatively high dielectric constant material (for example, silicon nitride with a dielectric constant of approximately seven). This lower capacitance and associated reduced power consumption may increase the performance of semiconductor devices employing the present invention. Thus, through use of the present invention, conductive interconnections may be formed more quickly and result in a structure that enhances device performance by reducing the capacitance between adjacent conductive lines and the overall power consumption of the device. Although the present invention has been discussed in the context of forming a single conductive plug and its associated conductive line, those skilled in the art will recognize that a plurality of these plugs and lines are formed across the surface of a given wafer during normal processing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming conductive interconnections comprised of a plurality of components on a semiconductor device, comprising:

forming a first layer comprised of an organic-based dielectric material;

patterning said first layer to define a first opening in said first layer corresponding to a conductive plug component of one of said interconnections;

forming a second layer comprised of a silicon-based dielectric material on said first layer and in said first opening, said organic-based and silicon-based dielectric materials being selectively etchable with respect to one another;

etching said second layer to define a second opening in said second layer corresponding to a conductive line component of one of said interconnections and to remove said silicon-based dielectric material from said first opening in said first layer; and forming a conductive material in said openings in said first and second layers.

2. The method of claim 1, wherein forming a first layer comprised of an organic-based dielectric material comprises forming a first layer comprised of one of a poly(arylene ether), a thermosetting oligomeric hydro-carbon, a poly (tetrafluoroethylene), a poly(para-xylylene), a poly(imide), and a divinyl siloxane benzocyclobutane.

3. The method of claim 2, wherein forming a second layer comprised of a silicon-based dielectric material comprises forming a second layer comprised of one of a fluorosilicate glass, hydrogen silsesquioxane (HSQ), silica xerogel, silica aerogel, silicon dioxide, boron doped silicon dioxide, phosphorous doped silicon dioxide, silicon oxynitride, and silicon nitride.

4. The method of claim 1, wherein forming a conductive material in said openings in said first and second layers comprises forming a metal or metal alloy in said openings in said first and second layers.

5. The method of claim 1, wherein forming a conductive material in said openings in said first and second layers comprises forming a conductive material comprised of copper, aluminum, titanium, tantalum, tungsten, or alloys of such materials, in said openings in said first and second layers.

6. The method of claim 1, wherein said second layer is formed on said first layer without an etch stop layer being formed between said first and second layers.

7. A method of forming conductive interconnections comprised of a plurality of components on a semiconductor device, comprising:

forming a first layer comprised of a silicon-based dielectric material;

patterning said first layer to define a first opening in said first layer corresponding to a conductive plug component of one of said interconnections;

forming a second layer comprised of an organic-based dielectric material on said first layer and in said first opening, said organic-based and silicon-based dielectric materials being selectively etchable with respect to one another;

etching said second layer to define a second opening in said second layer corresponding to a conductive line component of one of said interconnections and to remove said organic-based dielectric material from said first opening in said first layer; and forming a conductive material in said openings in said first and second layers.

8. The method of claim 7, wherein forming a second layer comprised of an organic-based dielectric material comprises forming a second layer comprised of one of a poly(arylene ether), a thermosetting oligomeric hydro-carbon, a poly (tetrafluoroethylene), a poly(para-xylylene), a poly(imide), and a divinyl siloxane benzocyclobutane.

9. The method of claim 8, wherein forming a first layer comprised of a silicon-based dielectric material comprises forming a first layer comprised of one of a fluorosilicate glass, hydrogen silsesquioxane (HSQ), silica xerogel, silica aerogel, silicon dioxide, boron doped silicon dioxide, phosphorous doped silicon dioxide, silicon oxynitride, and silicon nitride.

10. The method of claim 7, wherein forming a conductive material in said openings in said first and second layers comprises forming a metal or metal alloy in said openings in said first and second layers.

11. The method of claim 7, wherein forming a conductive material in said openings in said first and second layers comprises forming a conductive material comprised of copper, aluminum, titanium, tantalum, tungsten, or alloys of such materials, in said openings in said first and second layers.

12. The method of claim 7, wherein said second layer is formed on said first layer without an etch stop layer being formed between said first and second layers.

* * * * *